United States Patent

Asada

(10) Patent No.: US 9,231,558 B2
(45) Date of Patent: Jan. 5, 2016

(54) HIGH FREQUENCY POWER AMPLIFIER

(71) Applicant: Tomoyuki Asada, Tokyo (JP)

(72) Inventor: Tomoyuki Asada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 189 days.

(21) Appl. No.: 13/845,736

(22) Filed: Mar. 18, 2013

(65) Prior Publication Data

US 2014/0043111 A1    Feb. 13, 2014

(30) Foreign Application Priority Data

Aug. 7, 2012  (JP) .................................. 2012-174988

(51) Int. Cl.
*H03H 7/46*    (2006.01)
*H03H 11/02*    (2006.01)
*H03F 3/189*    (2006.01)

(52) U.S. Cl.
CPC .............. *H03H 11/02* (2013.01); *H03F 3/189* (2013.01); *H03H 7/46* (2013.01)

(58) Field of Classification Search
CPC ........... H03H 11/02; H03H 7/46; H03F 3/189
USPC .......................................... 333/126, 129, 132
See application file for complete search history.

(56) References Cited

U.S. PATENT DOCUMENTS

| 6,081,694 A | 6/2000 | Matsuura et al. |
| 8,872,599 B2 * | 10/2014 | Peng et al. ..................... 333/124 |
| 2004/0192406 A1 | 9/2004 | Okazaki et al. |
| 2013/0207732 A1 * | 8/2013 | Cabanillas et al. ........... 330/307 |

FOREIGN PATENT DOCUMENTS

| JP | 6-350375 A | 12/1994 |
| JP | 9-186533 A | 7/1997 |
| JP | 11-127040 A | 5/1999 |
| JP | 2001-332938 A | 11/2001 |
| JP | 2004-304521 A | 10/2004 |
| JP | 2005-102099 A | 4/2005 |
| JP | 2006-203652 A | 8/2006 |
| JP | 2011-211273 A | 10/2011 |

OTHER PUBLICATIONS

Japanese Patent Office; Office Action in Japanese Patent Application No. 2012-174988 (Oct. 27, 2015).

* cited by examiner

*Primary Examiner* — Robert Pascal
*Assistant Examiner* — Kimberly Glenn
(74) *Attorney, Agent, or Firm* — Leydig, Voit & Mayer, Ltd.

(57) ABSTRACT

A high frequency power amplifier includes an amplification element amplifying a high frequency signal; a duplexer to which an output signal of the amplification element is inputted, the duplexer allowing a signal of a certain frequency band to pass and attenuating signals of other frequency bands; a matching circuit connected between the amplification element and the duplexer; an external terminal connected to the matching circuit; and a passive element connected between the external terminal and a grounding point. The amplification element, the matching circuit, and the duplexer are integrally mounted on a single substrate. The passive element is located outside the substrate.

4 Claims, 3 Drawing Sheets

HIGH FREQUENCY POWER AMPLIFIER

BACKGROUND OF THE INVENTION

1. Field of the Invention

The present invention relates to a high frequency power amplifier used for CDMA (Code Division Multiple Access) or LTE (Long Term Evolution) cellular phones, portable terminals or the like, and in particular to a high frequency power amplifier which can realize desired performance at low cost for specified maximum output power conditions of a plurality of specifications.

2. Background Art

High frequency power amplifiers used for CDMA or LTE cellular phones, portable terminals or the like are required to realize a desired ACLR (Adjacent Channel Leakage Ratio) during specified maximum output power with low current consumption. A matching circuit in the high frequency power amplifier needs to be adjusted to achieve such desired high frequency performance (e.g., see Japanese Patent Laid-Open No. 11-127040).

SUMMARY OF THE INVENTION

The specified maximum output power required varies depending on cellular phone terminals or makers that manufacture cellular phone terminals. That is, there are a plurality of specifications of specified maximum output power. However, in a high frequency power amplifier in which an amplification element, a duplexer and a matching circuit disposed therebetween are integrally molded on the same substrate, the matching circuit is fixed and cannot be adjusted. Therefore, it is necessary to provide, as a lineup, high frequency power amplifiers of a plurality of specifications provided with a matching circuit which is adjusted so as to obtain desired high frequency performance according to the respective specified maximum output power levels. This poses a problem that development periods are lengthened, and development and manufacturing management costs increase.

In view of the above-described problems, an object of the present invention is to provide a high frequency power amplifier which can realize desired performance at low cost for specified maximum output power conditions of a plurality of specifications.

According to the present invention, a high frequency power amplifier comprises: an amplification element amplifying a high frequency signal; a duplexer to which an output signal of the amplification element is inputted, the duplexer allowing a signal of a certain frequency band to pass and attenuating signals of other frequency bands; a matching circuit connected between the amplification element and the duplexer; an external terminal connected to the matching circuit; and a passive element connected between the external terminal and a grounding point. The amplification element, the matching circuit, and the duplexer are integrally molded on an identical substrate. The passive element is provided outside the substrate.

The present invention makes it possible to realize desired performance at low cost for specified maximum output power conditions of a plurality of specifications.

Other and further objects, features and advantages of the invention will appear more fully from the following description.

DETAILED DESCRIPTION OF THE PREFERRED EMBODIMENTS

A high frequency power amplifier according to the embodiments of the present invention will be described with reference to the drawings. The same components will be denoted by the same symbols, and the repeated description thereof may be omitted.

First Embodiment

Figure 1:
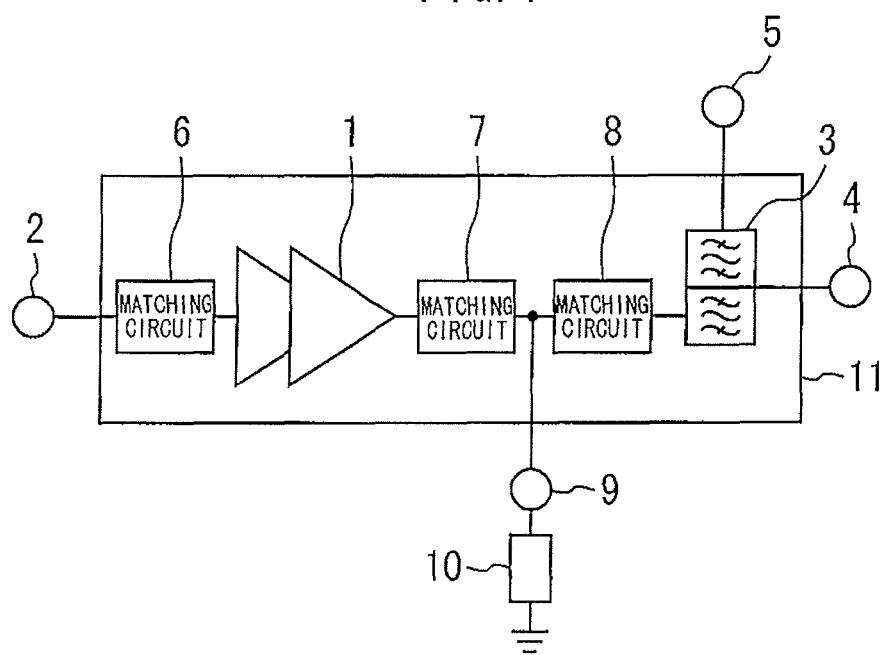
FIG. 1 is a diagram illustrating a high frequency power amplifier according to a first embodiment of the present invention.

FIG. 1 is a diagram illustrating a high frequency power amplifier according to a first embodiment of the present invention. An amplification element 1 amplifies a high frequency signal inputted from a transmission signal input terminal 2. The output signal of this amplification element 1 is inputted to a duplexer 3, and the duplexer 3 allows a signal of a certain frequency band to pass and attenuates signals of other frequency bands. The duplexer 3 is connected with a transmission signal output/received signal input terminal 4 and a received signal output terminal 5.

A matching circuit 6 connected to the input of the amplification element 1 causes the input impedance of the amplification element 1 to match the characteristic impedance. Matching circuits 7 and 8 are connected between the amplification element 1 and the duplexer 3 to cause the output impedance of the amplification element 1 to match the input impedance of the duplexer 3. An external terminal 9 is connected to the matching circuits 7 and 8. A passive element 10 is connected between the external terminal 9 and a grounding point. The amplification element 1, the matching circuits 6, 7 and 8, and the duplexer 3 are integrally molded on an identical substrate 11 and the passive element 10 is provided outside the substrate 11.

Figure 2:
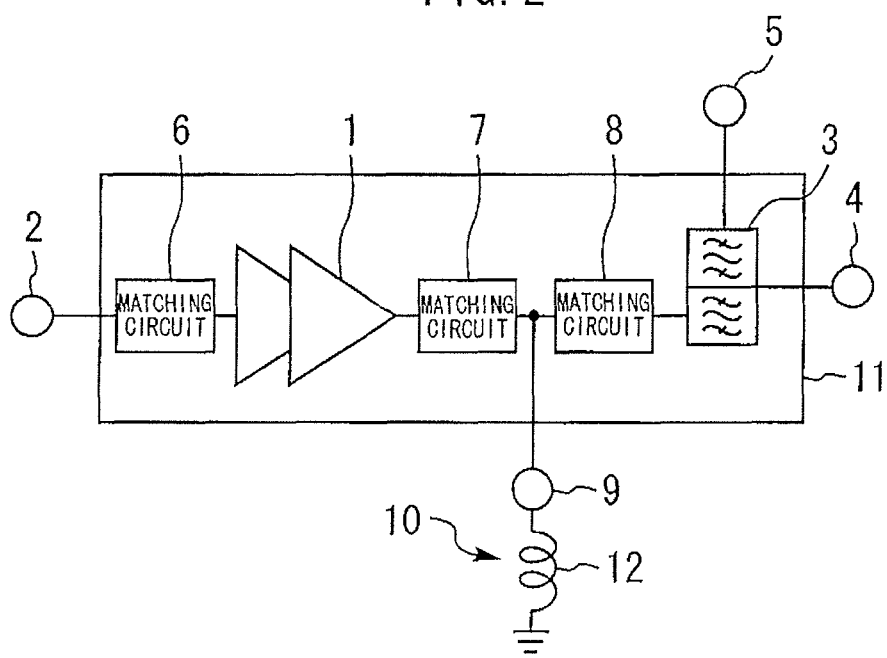
FIG. 2 is a diagram illustrating actual example 1 of the high frequency power amplifier according to the first embodiment of the present invention.
Figure 3:
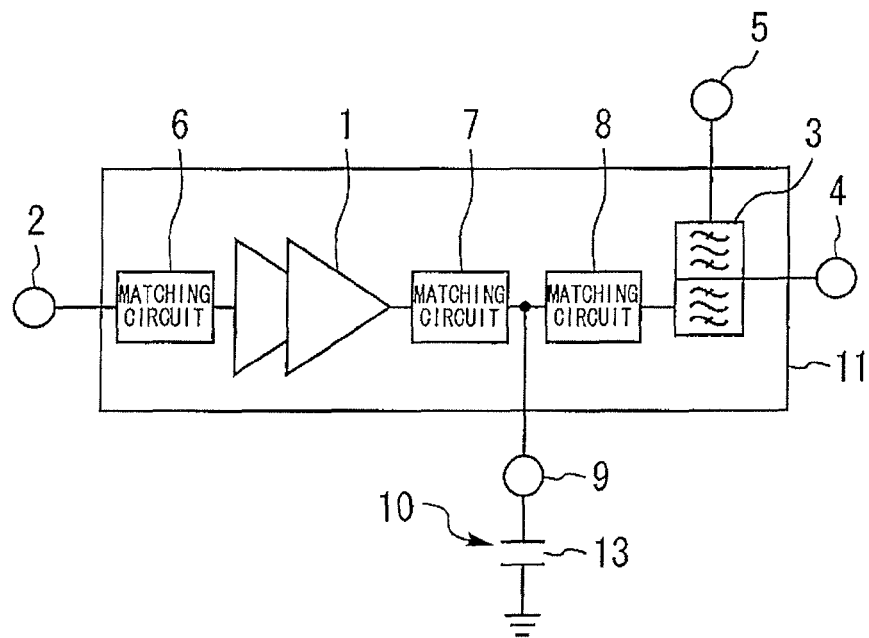
FIG. 3 is a diagram illustrating actual example 2 of the high frequency power amplifier according to the first embodiment of the present invention.

FIG. 2 is a diagram illustrating actual example 1 of the high frequency power amplifier according to the first embodiment of the present invention. An inductor 12 having a desired inductance is connected between the external terminal 9 and the grounding point as the passive element 10. FIG. 3 is a diagram illustrating actual example 2 of the high frequency power amplifier according to the first embodiment of the present invention. A capacitor 13 having a desired capacitance value is connected between the external terminal 9 and the grounding point as the passive element 10.

Next, effects of the present embodiment will be described in comparison with a comparative example. In the comparative example, neither the external terminal 9 nor the passive element 10 is provided. Since the matching circuits 7 and 8 integrally molded on the substrate 11 cannot be adjusted, in the comparative example, it is not possible to adjust the circuit constant of the matching circuit disposed between the amplification element 1 and the duplexer 3. The circuit constant of the matching circuits 7 and 8 is determined according to the specified maximum output power level outputted to the transmission signal output/received signal input terminal 4. For example, the circuit constant of the matching circuits 7 and 8 for achieving desired performance differs depending on whether the specified maximum output power level is 25 dBm, 26 dBm or 27 dBm. For this reason, in the comparative example, it is necessary to develop high frequency power amplifiers of a plurality of specifications provided with a matching circuit optimized for the respective specified maximum output power levels, resulting in a problem of cost increase.

Table 1 is a table comparing the comparative example and the performance of the first embodiment. In both the comparative example and the first embodiment, the matching circuits 7 and 8 are configured so that an ACLR during 26 dBm output satisfies target performance of −38 dBc or less.

TABLE 1

|  | 25 dBm output | | 26 dBm output | | 27 dBm output | |
| --- | --- | --- | --- | --- | --- | --- |
|  | current consumption | ACLR | current consumption | ACLR | current consumption | ACLR |
| comparative example | 310 mA | −43 dBc | 350 mA | −40 dBc | 400 mA | −35 dBc |
| actual example 1 | 345 mA | −45 dBc | 390 mA | −43 dBc | 450 mA | −40 dBc |
| actual example 2 | 270 mA | −40 dBc | 315 mA | −35 dBc | 370 mA | −31 dBc |
| target performance | <300 mA | <−38 dBc | <380 mA | <−38 dBc | <480 mA | <−38 dBc |

In the comparative example, linearity during 27 dBm output deteriorates, ACLR is −35 dBc, and the target performance is thereby not satisfied. To cause the ACLR during 27 dBm output to decrease to or below −38 dBc, a different high frequency power amplifier is required in which the matching circuits 7 and 8 are optimized in a 27 dBm output condition. Furthermore, in the comparative example, making current consumption during 25 dBm output equivalent to that of the first embodiment requires a different high frequency power amplifier in which the matching circuits 7 and 8 are optimized in a 25 dBm output condition.

In actual examples 1 and 2 of the first embodiment, the inductor 12 having a desired inductance is connected to the external terminal 9, and ACLR can thereby be set to −38 dBc or less. In actual example 2 of the first embodiment, the capacitor 13 having a desired capacitance value is connected to the external terminal 9, and ACLR can thereby be set to −38 dBc or less and current consumption can be reduced from that in the comparative example.

In contrast, in the present embodiment, the external terminal 9 connected to the matching circuits 7 and 8 is provided and it is possible to adjust the circuit constant of the matching circuit made up of the matching circuits 7 and 8, and the passive element 10 by changing the passive element 10 connected to the external terminal 9. Therefore, since the amplification element 1, the matching circuits 6, 7 and 8, and the duplexer 3 integrally molded on the substrate 11 can be used just as they are, it is not necessary to develop high frequency power amplifiers of a plurality of specifications according to the specified maximum output power levels. As a result, desired performance can be realized at low cost for specified maximum output power conditions of a plurality of specifications.

Second Embodiment

Figure 4:
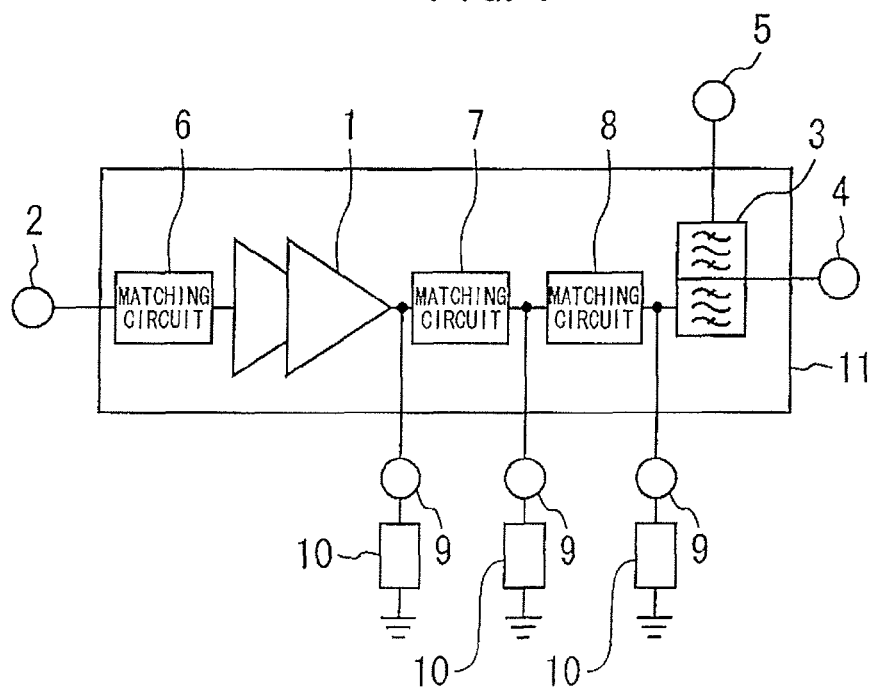
FIG. 4 is a diagram illustrating a high frequency power amplifier according to a second embodiment of the present invention.

FIG. 4 is a diagram illustrating a high frequency power amplifier according to a second embodiment of the present invention. The high frequency power amplifier of the first embodiment includes one external terminal 9 and one passive element 10. In contrast, according to the second embodiment, there are a plurality of external terminals 9, and a plurality of passive elements 10 connected between the plurality of external terminals 9 and grounding points. This makes it possible to cover more diversified specified maximum output power conditions.

Third Embodiment

Figure 5:
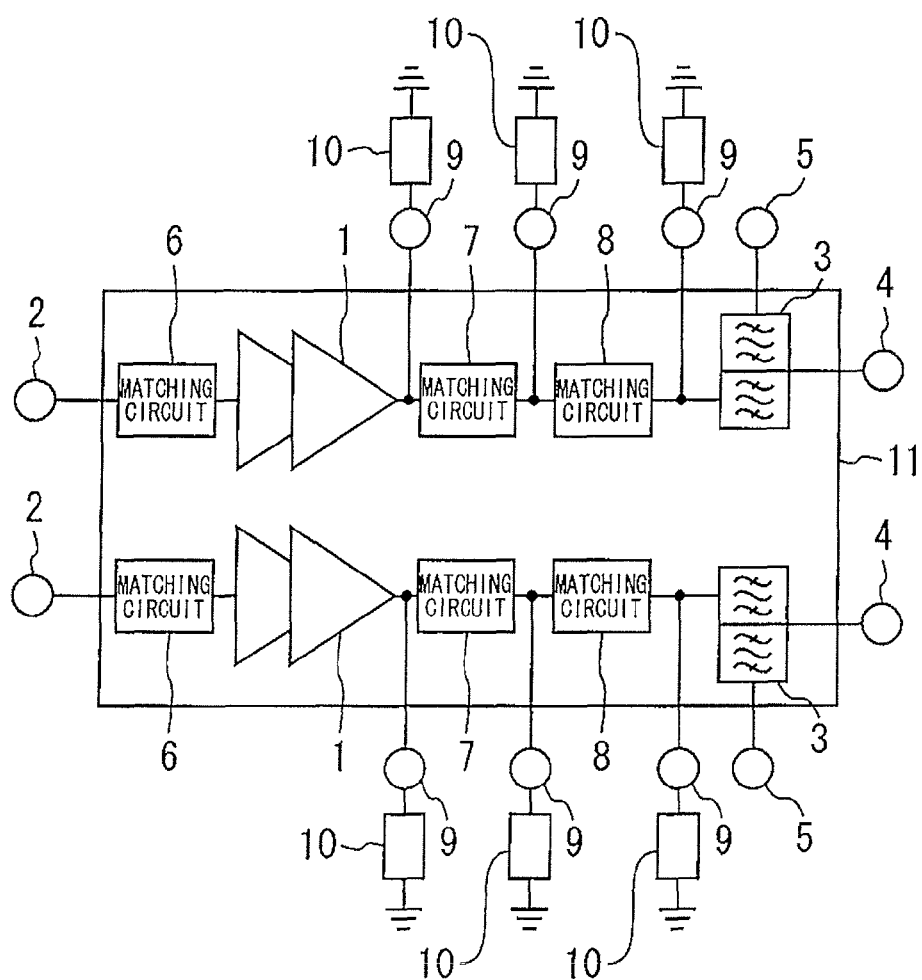
FIG. 5 is a diagram illustrating a high frequency power amplifier according to a third embodiment of the present invention.

FIG. 5 is a diagram illustrating a high frequency power amplifier according to a third embodiment of the present invention. Although the high frequency power amplifiers in the first and second embodiments have a single path, in the third embodiment, there are a plurality of paths each made up of an amplification element 1, matching circuits 6, 7 and 8, and a duplexer 3 on a semiconductor substrate 11. Effects similar to those of the first and second embodiments can also be obtained in this case as well.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-174988, filed on Aug. 7, 2012, including specification, claims, drawings, and summary, on which the Convention priority of the present application is based, is incorporated herein by reference in its entirety.

What is claimed is:

1. A high frequency power amplifier comprising:
   an amplification element amplifying a high frequency signal;
   a duplexer to which an output signal of the amplification element is input, wherein the duplexer passes a signal of a certain frequency band and attenuates signals of other frequency bands;
   first and second matching circuits connected in series, wherein an input of the first matching circuit is connected at a first junction point to an output of the amplification element, the first and second matching circuits are connected to each other at a second junction point, and an output of the second matching circuit is connected at a third junction point to an input of the duplexer;
   a first external terminal connected to the second junction point, between the first and second matching circuits; and
   a first passive element connected between the first external terminal and a grounding point, wherein the amplification element, the first and second matching circuits, and the duplexer are integrally mounted on a single substrate, and the first passive element is located outside the substrate.

2. The high frequency power amplifier according to claim 1, including second and third external terminals respectively connected to the first and third junction points, and second and third passive elements respectively connected between the second and third external terminals and the grounding point.

3. The high frequency power amplifier according to claim 1, including a plurality of signal paths on the substrate, wherein each signal path respectively includes an amplification element, first and second matching circuits, a first external terminal, and a duplexer, arranged according to claim 1.

4. The high frequency power amplifier according to claim 2, including a plurality of signal paths on the substrate, wherein each signal path respectively includes an amplification element, first and second matching circuits, first, second, and third external terminals, and a duplexer, arranged according to claim 2.

* * * * *